(12) United States Patent
Schrauwen

(10) Patent No.: US 11,912,863 B2
(45) Date of Patent: Feb. 27, 2024

(54) THERMOPLASTIC COMPOSITION FOR LASER DIRECT STRUCTURING

(71) Applicant: MEP EUROPE B.V., Geleen (NL)

(72) Inventor: Bernardus Antonius Gerardus Schrauwen, Geleen (NL)

(73) Assignee: MEP EUROPE B.V., Geleen (NL)

( * ) Notice: Subject to any disclaimer, the term of this patent is extended or adjusted under 35 U.S.C. 154(b) by 340 days.

(21) Appl. No.: 17/414,646

(22) PCT Filed: Nov. 6, 2019

(86) PCT No.: PCT/EP2019/080316
§ 371 (c)(1),
(2) Date: Jun. 16, 2021

(87) PCT Pub. No.: WO2020/126188
PCT Pub. Date: Jun. 25, 2020

(65) Prior Publication Data
US 2022/0135793 A1    May 5, 2022

(30) Foreign Application Priority Data

Dec. 19, 2018    (EP) .................................. 18213902

(51) Int. Cl.
  *H05K 1/03*    (2006.01)
  *C08L 69/00*    (2006.01)
  *C08K 3/22*    (2006.01)
  *H05K 3/10*    (2006.01)

(52) U.S. Cl.
  CPC ............ *C08L 69/00* (2013.01); *C08K 3/2279* (2013.01); *H05K 1/0373* (2013.01); *H05K 3/105* (2013.01); *C08K 2003/2231* (2013.01); *C08K 2003/2241* (2013.01); *C08K 2201/005* (2013.01); *H05K 2201/0129* (2013.01); *H05K 2201/10098* (2013.01)

(58) Field of Classification Search
  CPC ................. H05K 1/0373; H05K 3/105; H05K 2201/0129; C08K 2003/2241
  See application file for complete search history.

(56) References Cited

U.S. PATENT DOCUMENTS

| | | | |
|---|---|---|---|
| 5,380,795 A | 1/1995 | Gosens et al. | |
| 9,074,070 B2 | 7/2015 | Yung et al. | |
| 2005/0143520 A1 | 6/2005 | Saegusa et al. | |
| 2009/0292048 A1 | 11/2009 | Li et al. | |
| 2009/0292051 A1* | 11/2009 | Li | C23C 18/204 524/424 |
| 2012/0276390 A1* | 11/2012 | Ji | C08K 3/34 524/410 |
| 2012/0279764 A1* | 11/2012 | Jiang | C08K 3/26 524/502 |
| 2014/0162070 A1 | 6/2014 | Motegi et al. | |
| 2015/0210849 A1 | 7/2015 | Motegi et al. | |
| 2015/0315382 A1 | 11/2015 | Schrauwen | |
| 2015/0337132 A1* | 11/2015 | Van Der Burgt | C08L 77/02 524/404 |
| 2016/0215124 A1 | 7/2016 | Takano et al. | |
| 2018/0155546 A1* | 6/2018 | Van Der Burgt | C08L 77/00 |

FOREIGN PATENT DOCUMENTS

| | | |
|---|---|---|
| CN | 102066473 A | 5/2011 |
| CN | 103154135 A | 6/2013 |
| CN | 104023990 A | 9/2014 |
| CN | 104169348 A | 11/2014 |
| CN | 106032431 A | 10/2016 |
| DE | 102013007750 A1 | 11/2014 |
| GB | 2043083 A | 10/1980 |
| JP | 2014530263 A | 11/2014 |
| JP | 2015108075 A | 6/2015 |
| JP | 2016097589 A | 5/2016 |
| WO | 2009024496 A2 | 2/2009 |
| WO | 2009040772 A1 | 4/2009 |
| WO | 2012126831 A1 | 9/2012 |
| WO | 2013076314 A1 | 5/2013 |
| WO | 2015033955 A1 | 3/2017 |

OTHER PUBLICATIONS

Chinese Office Action dated May 7, 2022 for family member Application No. 201980084229.9.

* cited by examiner

*Primary Examiner* — Sherman Ng
(74) *Attorney, Agent, or Firm* — Hudak, Shunk & Farine Co. LPA

(57) ABSTRACT

A thermoplastic composition including a) 20 to 90 wt. % of a thermoplastic resin, b) 0.1 to 80 wt. % of a laser direct structuring additive and c) 10 to 80 wt. % of ceramic filler particles which do not have a laser direct structuring additive function, wherein at least 80 wt. % of c) is TiO2, wherein the composition has a loss tangent measured at 40 GHz of at most 0.014, wherein the total amount of a), b) and c) is 95 to 100 wt. % with respect to the total composition, wherein the composition further includes f) one or more additives, wherein the total amount of the additives is 0.1 to 5 wt. %, 0.3 to 5 wt. % or 0.3 to 3 wt. % relative to the total weight of the composition.

21 Claims, No Drawings

THERMOPLASTIC COMPOSITION FOR LASER DIRECT STRUCTURING

FIELD OF THE INVENTION

The present invention relates to a thermoplastic composition suitable for use in a laser direct structuring process. The invention also relates to a molded part comprising the composition. The invention also relates to a process for producing a circuit carrier by providing the molded part with a conductive track by a laser radiation and a subsequent metallization, and the circuit carrier obtainable thereby.

BACKGROUND OF THE INVENTION

With recent development in mobile phones including smartphone, many investigations have been made on methods of manufacturing an antenna inside the mobile phones. There has been a particular need for enabling three-dimensional design of the antenna inside the mobile phones. Laser direct structuring (occasionally referred to as "LDS", hereinafter) is one of known methods of forming such three-dimensional antenna. LDS is a technique of forming a plated layer, typically by irradiating laser to the surface of a resin molded article that contains an LDS additive, to thereby activate only the portion irradiated by the laser, and then by applying a metal to the activated portion. A desirable characteristic of this technique is that a metal structure, such as antenna, may be fabricated directly on the surface of a resin base, without using an adhesive or the like.

The developments in the smartphones have resulted in a demand for a high dielectric constant (Dk) and/or a low loss tangent (also known as a dissipation factor, Df) of the material for making antennas. A high Dk would enable the reduction of the size of the antenna while a low Df minimizes energy loss (heat) and/or maximizes the energy radiated. Current prior art materials have yet to provide an LDS material having a high Dk and low Df. In particular, the developments are directed to antennas which can be used at high frequencies.

This problem has been mentioned e.g. in US2009/0292051. US2009/0292051 discloses a thermoplastic composition comprising 10 to 90 wt. % of a thermoplastic base resin, 0.1 to 30 wt. % of a laser direct structuring additive and 10 to 80 wt. % of a ceramic filler. According to US2009/0292051, the LDS additives help increase the dielectric constant and thus less ceramic filler is needed to achieve the same levels of dielectric constant of the composition. The LDS additive is a heavy metal mixture oxide spinel or a copper salt. The ceramic filler used in the examples is a mixture of BaTiO3 and TiO2 at a ratio of 39/21.

SUMMARY OF THE INVENTION

It is an object of the invention to provide an LDS composition having a desirable radio frequency performance, in particular a low loss tangent at high frequencies.

Accordingly, the present invention provides a thermoplastic composition comprising:
a) 20 to 90 wt. % of a thermoplastic resin,
b) 0.1 to 80 wt. % of a laser direct structuring additive and
c) 10 to 80 wt. % of ceramic filler particles which do not have a laser direct structuring additive function, wherein at least 80 wt. % of c) is TiO2,
wherein the composition has a loss tangent measured at 40 GHz of at most 0.014.

Preferably, the total amount of a), b) and c) is 95 to 100 wt. % with respect to the total composition and the composition further comprises f) one or more additives, wherein the total amount of the additives is 0.1 to 5 wt. %, 0.3 to 5 wt. % or 0.3 to 3 wt. % relative to the total weight of the composition.

The inventors have surprisingly found that the use of TiO2 leads to the composition having a low loss tangent particularly at high frequencies compared to other types of ceramic filler materials such as BaTiO3. BaTiO3 is known for its desirable radio frequency performances and thus is the most commonly used material for the purpose of obtaining desirable radio frequency performances. It is surprising that TiO2 led to a significantly better result than the well-known BaTiO3 at high frequencies.

DETAILED DESCRIPTION OF THE INVENTION a) Thermoplastic Resin

The thermoplastic resin may comprise resins such as polycarbonate in particular aromatic polycarbonate, polyamide, polyester, polyesteramide, polystyrene, polymethyl methacrylate, polyphenylene ether, liquid crystal polymer (LCP), polyether ether ketone (PEEK), cyclic olefin (co) polymer (COP) or combinations thereof. The resins may be homopolymers, copolymers or mixtures thereof, and may be branched or non-branched.

Examples of suitable polyamides (PA) are aliphatic polyamides, that may be branched polyamides, such as PA6, PA46, PA66, PA6/66, PA 11, PA12, semi aromatic polyamides as MXD6, PA6I/6T, PA66/6T, PA4T fully aromatic polyamides and copolymers and blends of the listed polyamides. Examples of suitable polyesters are polyethylene terephtalate (PET), polybutylene terephtalate (PBT), polypropylene terephtalate (PPT), polyethylene naphtanoate (PEN), polybutylene naphtanoate (PBN). Preferred polyesters are polyethylene terephtalate and polybutylene terephtalate. Polyphenylene ether is typically used in combination with polyamide or polystyrene. Examples of suitable LCP are commercialized as Vectra® E845i LDS, E840i LDS, TECACOMP LCP LDS black4107. Examples of suitable PEEK are commercialized as TECACOMP PEEK LDS. Examples of suitable COP are commercialized as ZEONEX RS420-LDS Cyclo Olefin Polymer.

The thermoplastic resin may further comprise a rubber-like polymer. Examples of rubber-like polymer are described in WO-A-2009024496, which is incorporated herein by reference. The rubber-like polymer is or contains an elastomeric (i.e. rubbery) polymer having preferably a Tg less than about 10° C., more specifically less than about −10° C., or more specifically about −20° C. to −80° C.

In preferred embodiments, the thermoplastic resin is a polycarbonate-based resin. The polycarbonate-based resin may be polycarbonate or a blend of polycarbonate and a rubber-like polymer such as acrylonitrile butadiene styrene rubber (ABS). The polycarbonates may be homopolymers, copolymers and mixtures thereof, and may be branched or non-branched. Suitable polycarbonate-based resins are described e.g. in US2009/0292048, which is incorporated herein by reference.

Polycarbonates including aromatic carbonate chain units include compositions having structural units of the formula (I):

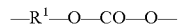

$$-R^1-O-CO-O- \quad (I)$$

in which the $R^1$ groups are aromatic, aliphatic or alicyclic radicals. Beneficially, $R^1$ is an aromatic organic radical and, in an alternative embodiment, a radical of the formula (II):

 (II)

wherein each of $A^1$ and $A^2$ is a monocyclic divalent aryl radical and $Y^1$ is a bridging radical having zero, one, or two atoms which separate $A^1$ from $A^2$. In an exemplary embodiment, one atom separates $A^1$ from $A^2$. Illustrative examples of radicals of this type are —O—, —S—, —S(O)—, —S(O2)-, —C(O)—, methylene, cyclohexyl-methylene, 2-[2,2,1]-bicycloheptylidene, ethylidene, isopropylidene, neopentylidene, cyclohexylidene, cyclopentadecylidene, cyclododecylidene, adamantylidene, or the like. In another embodiment, zero atoms separate $A^1$ from $A^2$, with an illustrative example being bisphenol. The bridging radical $Y^1$ can be a hydrocarbon group or a saturated hydrocarbon group such as methylene, cyclohexylidene or isopropylidene.

Suitable aromatic polycarbonate resins include polycarbonates made from at least a divalent phenol and a carbonate precursor, for example by means of the commonly known interfacial polymerization process or the melt polymersiation method. Suitable divalent phenols that may be applied are compounds having one or more aromatic rings that contain two hydroxy groups, each of which is directly linked to a carbon atom forming part of an aromatic ring.

Examples of such compounds are:
4,4'-dihydroxybiphenyl, 2,2-bis(4-hydroxyphenyl)propane (bisphenol A),
2,2-bis(4-hydroxy-3-methylphenyl)propane,
2,2-bis-(3-chloro-4-hydroxyphenyl)-propane,
2,2-bis-(3,5-dimethyl-4-hydroxyphenyl)-propane,
2,4-bis-(4-hydroxyphenyl)-2-methylbutane,
2,4-bis-(3,5-dimethyl-4-hydroxyphenyl)-2-methylbutane,
4,4-bis(4-hydroxyphenyl)heptane, bis-(3,5-dimethyl-4-hydroxyphenyl)-methane,
1,1-bis-(4-hydroxyphenyl)-cyclohexane,
1,1-bis-(3,5-dimethyl-4-hydroxyphenyl)-cyclohexane,
2,2-(3,5,3',5-tetrachloro-4,4-dihydroxydiphenyl)propane,
2,2-(3,5,3',5-tetrabromo-4,4-dihydroxydiphenyl)propane,
(3,3'-dichloro-4,4'-dihydroxyphenyl)methane,
bis-(3,5-dimethyl-4-hydroxyphenyl)-sulphon, bis-4-hydroxyphenylsulphon,
bis-4-hydroxyphenylsulphide.

The carbonate precursor may be a carbonyl halogenide, a halogen formate or carbonate ester. Examples of carbonyl halogenides are carbonyl chloride and carbonyl bromide. Examples of suitable halogen formates are bis-halogen formates of divalent phenols such as hydroquinone or of glycols such as ethylene glycol. Examples of suitable carbonate esters are diphenyl carbonate, di(chlorophenyl)carbonate, di(bromophenyl)carbonate, di(alkylphenyl)carbonate, phenyltolylcarbonate and the like and mixtures thereof. Although other carbonate precursors may also be used, it is preferred to use the carbonyl halogenides and in particular carbonylchloride, also known as phosgene.

The aromatic polycarbonate resins in the composition according to the invention may be prepared using a catalyst, an acid acceptor and a compound for controlling the molecular mass.

Examples of catalysts are tertiary amines such as triethylamine, tripropylamine and N,N-dimethylaniline, quaternary ammonium compounds such as tetraethylammoniumbromide and quaternary phosphonium compounds such as methyltriphenylfosfoniumbromide.

Examples of organic acid acceptors are pyridine, triethylamine, dimethylaniline and so forth. Examples of inorganic acid acceptors are hydroxides, carbonates, bicarbonates and phosphates of an alkali metal or earth alkali metal.

Examples of compounds for controlling the molecular mass are monovalent phenols such as phenol, p-alkylphenols and para-bromophenol and secondary amines.

Rubber-Like Polymer

Examples of the rubber-like polymer which may be blended with resins such as polycarbonate are described in WO-A-2009024496, which is incorporated herein by reference. The rubber-like polymer is or contains an elastomeric (i.e. rubbery) polymer having preferably a Tg less than about 10° C., more specifically less than about −10° C., or more specifically about −20° C. to −80° C.

Preferably, the amount of the rubber-like polymer in the thermoplastic resin a) is 0 to 60 wt. %, for example 1 to 50 wt. %, 5 to 40 wt. % or 10 to 30 wt. %, of the amount of the thermoplastic resin a).

Examples of elastomeric polymers include polyisoprene; butadiene based rubbers like polybutadiene, styrene-butadiene random copolymer and block copolymer, hydrogenates of said block copolymers, acrylonitrile-butadiene copolymer and butadiene-isoprene copolymer; acrylate based rubbers like ethylene-methacrylate and ethylene-butylacrylate, acrylate ester-butadiene copolymers, for example acrylic elastomeric polymers such as butylacrylate-butadiene copolymer; siloxane based rubbers like polyorganosiloxanes such as for example polydimethylsiloxane, polymethylphenylsiloxane and dimethyl-diphenylsiloxane copolymer; and other elastomeric polymers like ethylene-propylene random copolymer and block copolymer, copolymers of ethylene and [alpha]-olefins, copolymers of ethylene and aliphatic vinyl such as ethylene-vinyl acetate, and ethylene-propylene non-conjugated diene terpolymers such as ethylene-propylene-hexadiene copolymer, butylene-isoprene copolymer, and chlorinated polyethylene, and these substances may be used individually or in combinations of two or more.

Particularly preferred elastomeric polymers include ABS resin (acrylonitrile-butadiene-styrene copolymer), AES resin (acrylonitrile-ethylene-propylene-styrene copolymer), AAS resin (acrylonitrile-acrylic elastomer-styrene copolymer), and MBS (methyl methacrylate butadiene styrene copolymer). Particularly preferred graft copolymers are acrylonitrile butadiene styrene rubber (ABS), methylmethacrylate butadiene styrene rubber (MBS) or a mixture of these copolymers, because of the high compatibility between the polycarbonate matrix and such copolymers, thereby enabling that these copolymers can be uniformly dispersed into the polycarbonate matrix. This decreases any degradation of the thermoplastic resin that may be caused by certain types of component b). From an economic point of view acrylonitrile butadiene styrene (ABS) is even more preferred. Any commercially available ABS may be applied. Particularly preferred acrylonitrile butadiene styrene (ABS) is acrylonitrile butadiene styrene a rubber content of 10 to 50 parts by weight, preferably 10 to 40 parts by weight and even more preferably 10 to 30 parts by weight.

In particularly preferred embodiments, the thermoplastic resin a) is a blend of 45 to 75 wt. % of polycarbonate, 5 to 40 wt. % of ABS and 0 to 10 wt. % of MBS wherein the amounts are with respect to the thermoplastic resin a).

In some embodiments, the rubber is a graft copolymer comprising an elastomeric component containing Si. This has an advantage in the improved flame retardancy of the composition. The graft copolymer is formed by graft-copolymerizing an elastomeric component containing Si with a monomer component copolymerizable therewith. The elastomeric component generally has a glass transition temperature of at most 0 C, preferably at most −20° C., more preferably −30° C.

As the graft copolymer, core/shell type graft copolymers are preferable wherein the core is the elastomeric component containing Si. The elastomeric component containing Si is preferably polyorganosiloxane.

The graft copolymer is preferably a polyorganosiloxane containing graft copolymer preferably prepared by polymerizing 5 to 60 parts by weight of a vinyl monomer (I) in the presence of 40 to 95 parts by weight of polyorganosiloxanes particles (II) (the sum of (I) and (II) is 100 parts by weight), as for example described in US2005/0143520. Examples of the vinyl monomers (i) include, for example, aromatic vinyl monomers such as styrene, alpha-methylstyrene, p-methylstyrene, and p-butylstyrene; vinylcyanide monomers such as acrylonitrile and methacrylonitrile; (meth)acrylic acid ester monomers such as methyl acrylate, ethyl acrylate, propyl acrylate, butyl acrylate, 2-ethylhexyl acrylate, glycidyl acrylate, hydroxyethyl acrylate, hydroxybutyl acrylate, methyl methacrylate, ethyl methacrylate, butyl methacrylate, lauryl methacrylate, glycidyl methacrylate, and hydroxyethyl methacrylate; and carboxyl-group-containing vinyl monomers such as itaconic acid, (meth)acrylic acid, fumaric acid, and maleic acid. The vinyl monomer (a-I) may include a multifunctional monomer having at least two polymerizable unsaturated bonds per molecule, if necessary. Examples of the multifunctional monomers include allyl methacrylate, triallyl cyanurate, triallyl isocyanurate, diallyl phthalate, ethylene glycol dimethacrylate, 1,3-butylene glycol dimethacrylate, and divinylbenzene. The vinyl monomer (I) may be used alone or in combination. The polyorganosiloxane particles (II) are preferably prepared by emulsion polymerization of the constituent components. A normal seeded emulsion polymerization can be applied to the graft copolymerization and can be achieved by radical-polymerizing the vinyl monomer (I) in latex of the polyorganosiloxane particles (II).

These graft copolymers comprising polyorganosiloxane are commercially available, e.g. as Kane Ace MR01 and Kane Ace MR02 from Kaneka Company.

Other suitable graft copolymer comprising an elastomeric component containing Si include Metablen S-2001, Metablen S-2200 and Metabien SX-005 from Mitsubishi Rayon.

In particularly preferred embodiments, the thermoplastic resin a) is a blend of 80 to 99 wt. % of polycarbonate and 1 to 20 wt. % of the graft copolymer comprising an elastomeric component containing Si, wherein the amounts are with respect to the thermoplastic resin a).

In some embodiments, the thermoplastic resin a) is or comprises a polysiloxane-polycarbonate copolymer. Examples of the polysiloxane-polycarbonate copolymer are described e.g. in U.S. Pat. No. 5,380,795 and WO09040772. This also has an advantage in the improved flame retardancy of the composition.

The amount of a) in the composition of the present invention is 20 to 90 wt. %, for example at least 30 wt. %, at least 40 wt. %, at least 50 wt. % or at least 60 wt. % and/or at most 85 wt. %, at most 80 wt. %, at most 75 wt. %, at most 70 wt. %, at most 67 wt. % or at most 65 wt. %, with respect to the weight of the total composition.

b) Laser Direct Structuring Additive

In some preferred embodiments, b) comprises particles of an LDS additive.

In some preferred embodiments, b) comprises particles consisting of a core and a shell covering the core, wherein the shell is made of a material having an LDS additive function. The core is preferably made of a material having a high dielectric constant.

In the present specification, the term "particles of a material" is understood as a particulate component consisting of the material, irrespective of the shape (spherical, whisker, fibrous etc). This term is used to be distinguished from the cores of the core-shell particles.

Typically, b) consists either of particles of an LDS additive or of particles consisting of a core and a shell covering the core. b) may also consist of particles of an LDS additive and particles consisting of a core and a shell covering the core.

The terms "laser direct structuring additive" and "material having a laser direct structuring additive function" are understood to mean a material capable of forming a plated layer on an article made by 1) moulding a specimen made by adding 10 parts by weight of a candidate material of the LDS additive to 100 parts by weight of a thermoplastic resin for example polycarbonate, 2) irradiating the specimen by a laser and 3) subjecting the irradiated specimen to electroless plating. For example, step 2) may be irradiating the specimen to YAG laser of 1064 nm wavelength at an output of 13 W, a frequency of 20 kHz. and scanning speed of 2 m/s. For example, step 3) may be subjecting the irradiated specimen to electroless plating using a MID Copper 100 XB Strike plating bath (from MacDermid Performance Solutions).

Examples of the laser direct structuring additive or the material having a laser direct structuring additive function used for the shell include heavy metal mixture oxide spinels, such as copper containing spinels such as copper chromium oxide spinel, copper molybdenum oxide spinel and copper chromium manganese oxide spinel; copper salts, such as copper hydroxide phosphate copper phosphate, copper sulfate, cuprous thiocyanate; organic metal complexes, such as palladium/palladium-containing heavy metal complexes; tin containing oxides, such as antimony tin oxide (antimony-doped tin oxide), bismuth tin oxide (bismuth-doped tin oxide), aluminum tin oxide (aluminum-doped tin oxide) and molybdenum tin oxide (molybdenum-doped tin oxide); zinc containing metal oxides, such as aluminum zinc oxide (aluminum-doped zinc oxide), $Zn_xNi_{1-x}Fe_2O_4$, wherein the x is higher than 0.60 and lower than 0.85; calcium copper titanate and combinations thereof.

Examples of copper chromium oxide spinel include the ones such as sold under commercial name LD 5 from Shepherd Technologies.

Examples of antimony-doped tin oxide include the ones having a CIELab colour value L* of at least 45, as described in WO2012/126831. Further examples of antimony-doped tin oxide further include a mixed metal oxide comprising at least tin and a second metal selected from the group consisting of antimony, bismuth, aluminum and molybdenum, wherein the LDS additive comprises at least 40 wt. % of tin and wherein the weight ratio of the second metal to tin is at least 0.02:1 as described in WO2013/076314. Examples include Stanostat CP5C from Keeling & Walker and 25-3511 PK from Ferro.

As already mentioned, b) may consist of particles of an LDS additive. However, when b) comprises or consists of particles consisting of a core and a shell covering the core, wherein the shell is made of a material having an LDS additive function, the core is preferably selected such that it contributes to achieving desired radio frequency performances of the composition according to the invention.

Preferably, the core is made of a ceramic material, preferably selected from metal oxides, metal silicates, metal borides, metal carbides and metal nitrides.

Suitable examples of the metal oxides include magnesium oxide, titanium oxide (e.g. $TiO_2$), zinc oxide, copper oxide, cerium oxide, niobium oxide, tantalum oxide, yttrium oxide, zirconium oxide, aluminum oxide (e.g., alumina and/or fumed alumina), $CaTiO_3$, $MgZrSrTiO_6$, $MgTiO_3$, $MgAl_2O_4$, $BaZrO_3$, $BaSnO_3$, $BaNb_2O_6$, $BaTa_2O_6$, $WO_3$, $MnO_2$, $SrZrO_3$, $SnTiO_4$, $ZrTiO_4$, $CaZrO_3$, $CaSnO_3$, $CaWO_4$, $MgTa_2O_6$, $MgZrO_3$, $La_2O_3$, $CaZrO_3$, $MgSnO_3$, $MgNb_2O_6$, $SrNb_2O_6$, $MgTa_2O_6$, $Ta_2O_3$, barium titanate ($BaTiO_3$), strontium titanate ($SrTiO_3$), barium strontium titanate, strontium-doped lanthanum manganate, lanthanum aluminum oxides ($LaAlO_3$), calcium copper titanate ($CaCu_3Ti_4O_{12}$), cadmium copper titanate ($CdCu_3Ti_4O_{12}$), $Ca_{1-x}La_xMnO_3$, (Li, Ti) doped NiO, lanthanum strontium copper oxides (LSCO), yttrium barium copper oxides ($YBa_2Cu_3O_7$), lead zirconate titanate and lanthanum-modified lead zirconate titanate.

Examples of silicates are $Na_2SiO_3$, $LiAlSiO_4$, $Li_4SiO_4$, $BaTiSi_3O_9$, $Al_2Si_2O_7$, $ZrSiO_4$, $KAlSi_3O_8$, $NaAlSi_3O_8$, $CaAl_2Si_2O_8$, $CaMgSi_2O_6$ and $Zn_2SiO_4$. It is noted that mica and talc are not preferred as the core, since they do not contribute to achieving desired radio frequency performances.

Examples of borides are lanthanum boride ($LaB_6$), cerium boride ($CeB_6$), strontium boride ($SrB_6$), aluminum boride, calcium boride ($CaB_6$), titanium boride ($TiB_2$), zirconium boride ($ZrB_2$), vanadium boride ($VB_2$), tantalum boride ($TaB_2$), chromium borides (CrB and $CrB_2$), molybdenum borides ($MoB_2$, $Mo_2B_5$ and MoB) and tungsten boride ($W_2B_5$).

Examples of carbides are silicon carbide, tungsten carbide, tantalum carbide, iron carbide and titanium carbide.

Examples of nitrides include silicon nitride, boron nitride, titanium nitride, aluminum nitride and molybdenum nitride.

Preferably, the core is made of a ceramic material selected from metal oxides, metal borides, metal carbides and metal nitrides.

Preferably, the core is made of a metal oxide, more preferably titanium dioxide and/or barium titanate, most preferably titanium dioxide.

In some preferred embodiments, the core is made of titanium dioxide and/or barium titanate, preferably titanium dioxide, and the shell is made of antimony tin oxide.

The amount of b) is 0.1 to 80 wt. % with respect to the total composition. In some embodiments, the amount of b) is at least 20 wt. %, at least 25 wt. %, at least 30 wt. %, at least 31 wt. %, at least 32 wt. %, at least 33 wt. %, at least 34 wt. % or at least 35 wt. %, with respect to the total composition. In other embodiments, the amount of b) is less than 20 wt. %, less than 15 wt. %, less than 10 wt. % or less than 5 wt. %, with respect to the total composition.

In preferred embodiments, b) comprises a tin containing oxide such as antimony tin oxide and the amount of the tin containing oxide in the composition is at least 20 wt. % with respect to the total composition, preferably at least 25 wt. %, at least 30 wt. %, at least 31 wt %, at least 32 wt. %, at least 33 wt. %, at least 34 wt. % or at least 35 wt. %, with respect to the total composition. An LDS additive which is a tin containing oxide has a large influence in obtaining desired radio frequency properties.

Preferably, the LDS additive has a particle size d90 of at most 8 μm, more preferably at most 5 μm, more preferably at most 4 μm, more preferably at most 2 μm, as determined by light scattering technology.

Preferably, the LDS additive has a particle size d50 of at most 5 μm, more preferably at most 4 μm, more preferably at most 2 μm, as determined by light scattering technology.

The LDS additive having a smaller size was found to give a good mechanical strength to the composition according to the present invention.

The particle size may e.g. be determined by light scattering technology using a Malvern Mastersize particle size analyzer. This may be done according to e.g. ISO13320-1: 2009.

c) Ceramic Filler Particles Which do not Have a Laser Direct Structuring Additive Function Component c) are particles of a ceramic material which does not have an LDS additive function. At least 80 wt. % of such material is $TiO_2$ in the composition according to the invention, which results in the composition having a low loss tangent at high frequencies.

At least 80 wt. % of the ceramic filler particles which do not have a laser direct structuring additive function present in the composition according to the invention is $TiO_2$. Preferably, the amount of $TiO_2$ with respect to the ceramic filler particles which do not have a laser direct structuring additive function present in the composition according to the invention is at least 90 wt. %, at least 95 wt. %, at least 99 wt. % or 100 wt. %.

The composition according to the invention may additionally comprise other ceramic filler particles which do not have a laser direct structuring additive function, although their amounts are limited to at most 20 wt. % of c).

Preferably, the further ceramic filler particles which do not have a laser direct structuring additive function which may be present in the composition are made of a ceramic material, preferably selected from metal oxides, metal silicates, metal borides, metal carbides and metal nitrides which do not have an LDS additive function.

Preferably, the further ceramic filler particles are made of a metal oxide.

In some preferred embodiments, the composition does not comprise barium titanate.

The amount of c) is 10 to 80 wt. % with respect to the total composition.

Preferably, the amount of c) is at least 15 wt. %, at least 20 wt. %, at least 25 wt. %, at least 30 wt. % or at least 35 wt. %, and/or at most 70 wt. %, at most 60 wt. %, at most 50 wt. % or at most 40 wt. %, with respect to the total composition.

Preferably, the total amount of b) and c) with respect to the total composition is at least 15 wt. %, at least 20 wt. %, at least 25 wt. %, at least 30 wt. %, at least 33 wt. % or at least 35 wt. %, and/or at most 70 wt. %, at most 60 wt. %, at most 50 wt. % or at most 40 wt %.

It is noted that WO2012/126831 discloses in Ex 7 a composition comprising 5 wt. % of an LDS additive and 10 wt. % of $TiO_2$. The LDS additive was mica coated with antimony-doped tin oxide. The use of mica in the LDS additive leads to the composition having a high loss tangent and thus the composition of Ex 7 has a loss tangent of higher than 0.014 measured at 40 GHz.

It is further noted that WO2013/076314 discloses in Ex 1 a composition comprising 5 wt. % of antimony tin oxide and 7 wt. % of $TiO_2$. The total amount of antimony tin oxide and $TiO_2$ is small and thus the composition of Ex 1 of WO2013/076314 has a loss tangent of higher than 0.014 measured at 40 GHz.

Total of a), b) and c)

Preferably, the total amount of the components a), b) and c) is 90 to 100 wt. % of the total composition, for example 90 to 99.9 wt. %, 92 to 99.0 wt. % or 95 to 98 wt. %, with respect to the total composition. Preferably, the total amount of the components a), b) and c) is at least 96 wt. %, at least 97 wt. %, at least 98 wt. % or at least 99 wt. %, with respect to the total composition.

Properties

Preferably, the composition according to the invention has a dielectric constant measured at 1 GHz of at least 3.5, more preferably at least 4.0, more preferably at least 4.2, more preferably at least 4.5, more preferably at least 4.7, more preferably at least 5.0.

Preferably, the composition according to the invention has a tangent loss measured at 1 GHz of at most 0.014, more preferably at most 0.010, more preferably at most 0.007.

Preferably, the composition according to the invention has a dielectric constant measured at 40 GHz of at least 3.5, more preferably at least 4.0, preferably at least 4.2, more preferably at least 4.5, more preferably at least 4.7, more preferably at least 5.0.

The composition according to the invention has a tangent loss measured at 40 GHz of at most 0.014, preferably at most 0.010, more preferably at most 0.007.

d) Flame Retardant

The thermoplastic composition according to the invention may further comprise d) a flame retardant.

Preferably, the amount of the component d) is 0-15 wt. %, for example 0.1-10 wt. %, with respect to the total composition. The presence of the component d) is optional, and hence the composition according to the invention may be essentially free of component d). This may mean that the amount of the component d) is less than 1 wt. %, less than 0.5 wt. %, less than 0.1 wt. % or 0 wt. %, with respect to the total composition.

The flame retardant may be an inorganic flame retardant or an organic flame retardant.

Examples of inorganic flame retardants include sulfonate salts such as potassium perfluorobutane sulfonate (Rimar salt) and potassium diphenylsulfone sulfonate; salts formed by reacting for example an alkali metal or alkaline earth metal (preferably lithium, sodium, potassium, magnesium, calcium and barium salts) and an inorganic acid complex salt, for example, an oxo-anion, such as alkali metal and alkaline-earth metal salts of carbonic acid, such as Na2CO3, K2CO3. MgCO3, CaCO3, BaCO3, and BaCO3 or fluoro-anion complex such as Li3AlF6, BaSiF6, KBF4, K3AlF6, KAlF4, K2SiF6, and/or Na3AlF6 or the like. Inorganic flame retardants are advantageous for the purpose of maintaining Vicat temperature.

Examples of organic flame retardants include an organic phosphate and/or an organic compound containing phosphorus-nitrogen bonds.

One type of exemplary organic phosphate is an aromatic phosphate of the formula $(GO)_3P=O$, wherein each G is independently an alkyl, cycloalkyl, aryl, alkaryl, or aralkyl group, provided that at least one G is an aromatic group. Two of the G groups may be joined together to provide a cyclic group, for example, diphenyl pentaerythritol diphosphate, which is described by Axelrod in U.S. Pat. No. 4,154,775. Other suitable aromatic phosphates may be, for example, phenyl bis(dodecyl) phosphate, phenyl bis(neopentyl) phosphate, phenyl bis(3,5,5'-trimethylhexyl) phosphate, ethyl diphenyl phosphate, 2-ethylhexyl di(p-tolyl) phosphate, bis (2-ethylhexyl) p-tolyl phosphate, tritolyl phosphate, bis(2-ethylhexyl) phenyl phosphates, tri(nonylphenyl) phosphate, bis(dodecyl) p-tolyl phosphate, dibutyl phenyl phosphate, 2-chloroethyl diphenyl phosphate, p-tolyl bis(2,5,5'-trimethylhexyl) phosphate, 2-ethylhexyl diphenyl phosphate, or the like. A specific aromatic phosphate is one in which each G is aromatic, for example, triphenyl phosphate, tricresyl phosphate, isopropylated triphenyl phosphate, and the like.

Di- or polyfunctional aromatic phosphorus-containing compounds are also useful, for example, compounds of the formulas below:

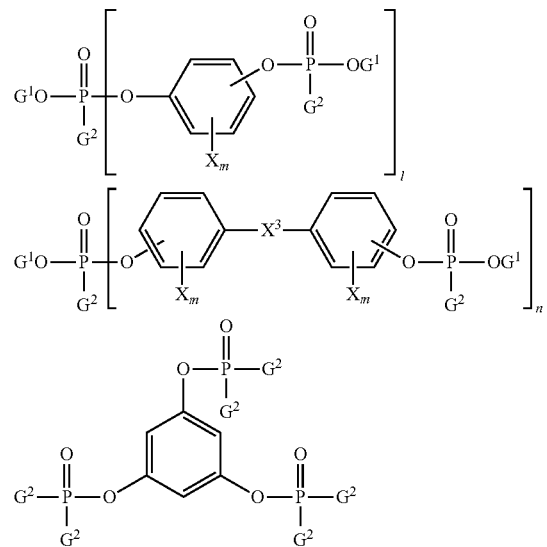

wherein each $G^1$ is independently a hydrocarbon having 1 to 30 carbon atoms; each $G^2$ is independently a hydrocarbon or hydrocarbonoxy having 1 to 30 carbon atoms; each X is independently a bromine or chlorine; m 0 to 4, and n is 1 to 30. Examples of suitable di- or polyfunctional aromatic phosphorus-containing compounds include resorcinol tetra-phenyl diphosphate (RDP), the bis(diphenyl) phosphate of hydroquinone and the bis(diphenyl) phosphate of bisphenol-A (respectively, their oligomeric and polymeric counterparts, and the like. Methods for the preparation of the aforementioned di- or polyfunctional aromatic compounds are described in British Patent No. 2,043,083.

The thermoplastic compositions of the present invention may be essentially free of chlorine and bromine, particularly chlorine and bromine flame-retardants, which may be defined as having a bromine and/or chlorine content of less than 100 ppm, less than 75 ppm or less than 50 ppm with respect to the total composition.

Preferably, a molded part of the composition has at least UL94 V1 rating (ie. V1 or V0 rating) at a thickness of 3.0 mm (±10%).

More preferably, a molded part of the composition has UL94 V1 or V0 rating at a thickness of 1.5 mm (±10%).

Total of a), b), c) and d)

Preferably, the total amount of the components a), b), c) and d) is 90 to 100 wt. % of the total composition, for example 90 to 99.9 wt. %, 92 to 99.0 wt. % or 95 to 98 wt. %, with respect to the total composition. Preferably, the total amount of the components a), b), c) and d) is at least 96 wt. %, at least 97 wt. %, at least 98 wt. % or at least 99 wt. %, with respect to the total composition.

Component e) Anti-Drip Agent

The thermoplastic composition according to the invention may further comprise e) an anti-drip agent.

Preferably, the amount of the component e) is 0-2.0 wt. % or 0.05-2.0 wt. %, more preferably 0.1-1.5 wt. %, more preferably 0.2-1.0 wt. %, with respect to the total composition. The presence of the component e) is optional, and hence the composition according to the invention may comprise little or no component e). For example, the amount of the component e) may be less than 0.05 wt. %, less than 0.01 wt. % or 0 wt. %, with respect to the total composition.

Suitable examples of anti-drip agents include fluoropolymers such as polytetrafluoroethylene (PTFE). The fluoropolymers may be a fibril forming fluoropolymer such as fibril forming polytetrafluoroethylene (PTFE) or a non-fibril forming fluoropolymer such as non-fibril forming polytetrafluoroethylene.

The anti-drip agent may be in the form of an (aqueous) dispersion of a fluoropolymer. In this case, the dispersion contains a sufficient amount of a fluoropolymer, e.g. at least 30 wt. % or at least 50 wt. % of the dispersion.

The anti-drip agent may be in the form of a mixture of a fluoropolymer and a further polymer, for example an encapsulated fluoropolymer. In this case, the dispersion contains a sufficient amount of a fluoropolymer, e.g. at least 30 wt. % or at least 50 wt. % of the mixture. The further polymer may e.g. be an acrylate copolymer or styrene-acrylonitrile. An example of a mixture of a fluoropolymer and an acrylate polymer is commercially available as METABLEN A-3800 from Mitsubishi Rayon. An encapsulated fluoropolymer may be made by polymerizing the polymer in the presence of the fluoropolymer.

Preferably, the anti-drip agent is a mixture of a fluoropolymer and a further polymer, such as an encapsulated fluoropolymer. Such anti-drip can be handled better compared to an anti-drip agent in the form of a dispersion, since the feeding in an extruder is easier and no removal of water from the composition is required.

Total of a), b), c), d) and e)

Preferably, the total amount of the components a), b), c), d) and e) is 90 to 100 wt. % of the total composition, for example 90 to 99.9 wt. %, 92 to 99.0 wt. % or 95 to 98 wt. %, with respect to the total composition. Preferably, the total amount of the components a), b), c), d) and e) is at least 96 w.t %, at least 97 wt. %, at least 98 wt. % or at least 99 wt. %, with respect to the total composition.

Other Additives f)

The thermoplastic composition according to the invention may further comprise f) 0 to 10 wt. % of one or more other additives, relative to the total weight of the composition. These include the customary additives such as stabilizers against thermal or thermo-oxidative degradation, stabilizers against hydrolytic degradation, stabilizers against degradation from light, in particular UV light, and/or photo-oxidative degradation and processing aids such as release agents and lubricants. Suitable examples of such additives and their customary amounts are stated in the aforementioned Kunststoff Handbuch, 3/1. The total amount of the additives is typically 0 to 5 wt. %, for example 0.1 to 3 wt. % or 0.3 to 1 wt. %. For example, the total amount of the additives is 0.1 to 5 wt. %, 0.3 to 5 wt. %, 0.5 to 5 wt. %, 1 to 5 wt. % or 1.5 to 5 wt. %, relative to the total weight of the composition.

Total of a), b), c), d), e) and f)

Preferably, the total amount of the components a), b), c), d), e) and f) is 100 wt. % of the total composition.

The composition according to the invention is essentially free of fillers, such as fibrous fillers (e.g. glass fibers) or mineral fillers (e.g. calcium carbonate, highly dispersible silicic acid, alumina, aluminium hydroxide, talc powder, mica, wollastonite, quartz sand, silica sand). Accordingly, the composition according to the invention comprises Less than 5 wt. %, preferably less than 4 wt. %, less than 3 wt. %, less than 2 wt. %, less than 1 wt. %, less than 0.5 wt. %, less than 0.1 wt % or 0 wt. % of fillers, such as fibrous fillers or mineral fillers, relative to the total weight of the composition.

The components b) and c) and optional components as described above may be introduced into the thermoplastic resin a) by means of suitable mixing devices such as single-screw or twin-screw extruders, preferably a twin-screw extruder is used. Preferably, thermoplastic resin pellets are introduced into the extruder together with at least components b) and c) and extruded, then quenched in a water bath and then pelletized. The invention therefore further relates to a process for producing a thermoplastic composition according to the present invention by melt mixing components a) and b) and c) and optional components as described above.

Other Aspects

The invention further relates to a molded part comprising the thermoplastic composition according to the present invention. The invention relates in particular to a molded part produced by injection moulding of the composition according to the invention. The invention further also relates to an article, in particular a circuit carrier, that contains a molded part produced from the composition according to the invention and a conductive track provided thereon. In one embodiment, such a circuit carrier is used for producing an antenna.

The invention further relates to a process for producing such a circuit carrier, which process comprises the steps of providing a molded part comprising the thermoplastic composition according to the present invention, irradiating areas of said part on which conductive tracks are to be formed with laser radiation, and subsequently metallizing the irradiated areas. In a preferred embodiment, the laser irradiation is used to simultaneously release metal nuclei and effect ablation of the part while forming an adhesion-promoting surface. This provides a simple means to achieve excellent adhesive strength of the deposited metallic conductor tracks. The wavelength of the laser is advantageously 248 nm, 308 nm, 355 nm, 532 nm, 1064 nm or of even 10600 nm. The deposition of further metal onto the metal nuclei generated by laser radiation preferably takes place via plating processes. Said metallization is preferably performed by immersing the molded part in at least one electroless plating bath to form electrically conductive pathways on the irradiated areas of the molded part. Non-limiting examples of electroless plating processes are a copper plating process, gold plating process, nickel plating process, silver plating, zinc plating and tin plating. Preferably, the first plating is copper plating. The conductive track may have one or more layers. The first layer may e.g. be a copper layer and may be 8-16 µm, more typically 8-12 µm. If present, the second layer may e.g. be a nickel layer and may be 2-4 µm. If present, the third layer may be e.g. be a gold layer and may be 0.05-0.2 µm.

The irradiation of the molded part may e.g. be performed under conditions comprising a power of 2-15 W, a frequency of 20-100 kHz and/or a speed of 1-5 m/s.

The irradiation of the molded part may e.g. be performed by UV light having a wavelength from 100 to 400 nm, visible light having a wavelength from 400 to 800 nm, or infrared light having a wavelength from 800 to 25 000 nm.

When the irradiation of the molded part is performed by UV light having a wavelength from 100 to 400 nm, it may be preferable that the molded part with the metallized areas is subjected to thermal processing for improving the delamination resistance. The thermal processing may be performed by subjecting the molded part to microwave e.g. by placing the molded part in a microwave oven. Preferably, the irradiation of the molded part is performed by visible light having a wavelength from 400 to 800 nm, or infrared light having a wavelength from 800 to 25 000 nm. These types of laser radiation are advantageous in that the metal layer on the irradiated areas has a relatively stronger adhesion strength without requiring thermal processing after the plating step. Most preferably, the irradiation of the molded part is performed by infrared light having a wavelength from 800 to 25 000 nm, in particular 1064 nm.

Preferably, the process for producing the circuit carrier does not comprise a step of thermal processing after the step of metalizing the irradiated areas. This is advantageous in view of allowing an efficient process.

A further aspect of the present invention relates to the thermoplastic composition according to the invention for use in a laser direct structuring process.

A further aspect of the present invention relates to use of the thermoplastic composition according to the invention in a laser direct structuring process.

It is noted that the invention relates to all possible combinations of features described herein, preferred in particular are those combinations of features that are present in the claims. It will therefore be appreciated that all combinations of features relating to the composition according to the invention; all combinations of features relating to the process according to the invention and all combinations of features relating to the composition according to the invention and features relating to the process according to the invention are described herein. It will therefore be appreciated that the combinations of the features relating to the moulding step, the irradiating step and the metallizing step of the process of the invention and the features relating to the composition according to the invention are described herein. For example, the present description discloses a process for producing a circuit carrier, comprising providing the molded part comprising the thermoplastic composition according to the invention; irradiating areas of said part on which conductive tracks are to be formed with laser radiation; and subsequently metalizing the irradiated areas, wherein the composition comprises component d) and the irradiation of the molded part is performed by infrared light having a wavelength from 800 to 25 000 nm.

It is further noted that the term 'comprising' does not exclude the presence of other elements. However, it is also to be understood that a description on a product comprising certain components also discloses a product consisting of these components. Similarly, it is also to be understood that a description on a process comprising certain steps also discloses a process consisting of these steps. The product/composition consisting of these components may be advantageous in that it offers a simpler, more economical process for the preparation of the product/composition. Similarly, it is also to be understood that a description on a process comprising certain steps also discloses a process consisting of these steps. The process consisting of these steps may be advantageous in that it offers a simpler, more economical process.

When values are mentioned for a lower limit and an upper limit for a parameter, ranges made by the combinations of the values of the lower limit and the values of the upper limit are also understood to be disclosed.

The invention is now elucidated by way of the following examples, without however being limited thereto.

Experiments

Comparative experiments (CEx) and example compositions (Ex) were prepared from the components as given in Table 1. Additionally, additives for Mold Release (0.3% Loxiol P861/3.5, supplied by Cognis), Stabilization (0.05% ADK Stab 2112, supplied by ADK Palmerole) and Anti-Dripping (0.40% Dispersion 40, supplied by Dupont) were added.

All sample compositions were prepared according the amounts as given in Tables 2 and 3. All amounts are in weight percentage. In each of the experiments, samples were extruded on a co-rotating twin screw extruder at a temperature of 280°. The extrudate was granulated and the collected granulate was dried for 4 hours at a temperature of 110° C. and subsequently injection moulded into test parts, using a melt temperature of approximately 290° C.-300° C.

The Radio Frequency properties—Dielectric Constant (DC) and Dissipation Factor (DF)—were measured at 1 GHz & 40 GHz using the guidelines of ASTM D-2520, Method—Resonant Cavity Perturbation Technique. Nominal sample size at 1 GHz was 4.7*9.1*51 mm and at 40 GHz 0.63*0.63*12.6 mm. Testing was done at laboratory ambient conditions (23° and 51% RH nominal.)

Izod Notched impact strength was measured according to ISO180/4A at a temperature of 23° C.

TABLE 1

| Material | Type | Supplier |
| --- | --- | --- |
| PC 1 | PC with LVN (ISO 1628/4) = 50 ml/g | MEP |
| ABS | Santac ST-55 | NAL |
| MBS | Kane Ace M732 | Kaneka |
| Si Modifier | Kane Ace MR-02 | Kaneka |
| TiO2 | Kronos 2233 | Kronos |
| BaTi | Barium Titanate E2 | Thermograde |
| LDS additive 1 | Stanostat CP5C ((Sn/Sb)O2), particle size d50 of 1.0 μm | Keeling & Walker |
| LDS additive 2 | Iriotec 8820 (Mica + (Sn/Sb)O2 + TiO2), particle size d50 of 8.25 μm | Merck |

TABLE 2

| | | Sample | | | | | |
| --- | --- | --- | --- | --- | --- | --- | --- |
| Components | Unit | Ex 1 | CEx 1 | CEx 2 | CEx 3 | Ex 2 | CEx 4 |
| PC 1 | % | 45.25 | 45.25 | 45.25 | 45.25 | 36.25 | 36.25 |
| ABS | % | 25 | 25 | 25 | 25 | 20 | 20 |
| MBS | % | 4 | 4 | 4 | 4 | 3 | 3 |
| LDS Additive 1 | % | 5 | 5 | | | 5 | 5 |
| LDS Additive 2 | % | | | 5 | 5 | | |
| TiO2 | % | 20 | | 20 | | 35 | |
| BaTi | % | | 20 | | 20 | | 35 |
| Other Additives | % | 0.75 | 0.75 | 0.75 | 0.75 | 0.75 | 0.75 |
| Total | % | 100 | 100 | 100 | 100 | 100 | 100 |

TABLE 2-continued

| Components | Unit | Ex 1 | CEx 1 | CEx 2 | CEx 3 | Ex 2 | CEx 4 |
|---|---|---|---|---|---|---|---|
| Properties | | | | | | | |
| Density | g/cm$^3$ | 1.37 | 1.41 | 1.35 | 1.39 | 1.58 | 1.66 |
| Izod N impact | kJ/m$^2$ | 58 | 29 | 47 | 15 | 33 | 4 |
| RF Performance | | | | | | | |
| DC @ 1 GHz | — | 3.65 | 3.64 | 4.72 | 4.62 | 4.74 | 4.74 |
| DF @ 1 GHz | — | 0.006 | 0.008 | 0.024 | 0.027 | 0.006 | 0.008 |
| DC @ 40 GHz | — | 3.82 | 3.81 | X | X | 4.64 | 4.52 |
| DF @ 40 GHz | — | 0.009 | 0.019 | X | X | 0.010 | 0.015 |

X indicates that the property could not be measured.

It can be seen (Ex 1 vs CEx 1; CEx 2 vs CEx 3; Ex 2 vs CEx 4) that the use of TiO2 leads to a higher dielectric constant and a lower dissipation factor compared to BaTiO3. The difference in the dissipation factor at 40 GHz is particularly large. Moreover, the use of TiO2 leads to a better impact strength.

Comparison between Ex 1 and CEx 2 shows that the difference in the LDS additive led to a substantial difference in the radio frequency properties. Ex 1 which contains 5 wt. % of ATO led to desirable properties than CEx 2 in which a substantial portion of the LDS additive is mica.

TABLE 3

| Components | Unit | Ex 3 | CEx 5 |
|---|---|---|---|
| PC 1 | % | 56.25 | 56.25 |
| Si Modifier | % | 3 | 3 |
| LDS Additive 1 | % | 5 | 5 |
| TiO2 | % | 35 | 15 |
| BaTi | % | | 20 |
| Other Additives | % | 0.75 | 0.75 |
| Total | % | 100 | 100 |
| Properties | | | |
| Density | g/cm$^3$ | 1.66 | 1.70 |
| Izod N Impact | kJ/m$^2$ | 31 | 29 |
| RF Performance | | | |
| DC @ 1 GHz | — | 4.72 | 4.73 |
| DF @ 1 GHz | — | 0.007 | 0.008 |
| DC @ 40 GHz | — | 5.02 | 4.69 |
| DF @ 40 GHz | — | 0.011 | 0.019 |

Comparison between Ex 3 and CEx 5 shows that the use of TiO2 leads to a substantially lower dissipation factor at 40 GHz compared to a mixture of TiO2 and BaTiO3.

The invention claimed is:

1. A thermoplastic composition, comprising:
   a) 20 to 90 wt. % of a thermoplastic resin,
   b) 0.1 to 80 wt. % of a laser direct structuring additive and
   c) 10 to 80 wt. % of ceramic filler particles which do not have a laser direct structuring additive function, wherein at least 80 wt. % of c) is TiO2,
   wherein the composition has a loss tangent measured at 40 GHz of at most 0.014,
   wherein the total amount of a), b) and c) is 95 to 100 wt. % with respect to the total composition, wherein the composition further comprises f) one or more additives, wherein the total amount of the additives is 0.1 to 5 wt. % relative to the total weight of the composition.

2. The composition according to claim 1, wherein a) is a polycarbonate-based resin.

3. The composition according to claim 1, wherein b) comprises a tin containing oxide and the amount of the tin containing oxide in the composition is at least 20 wt. % with respect to the total composition.

4. The composition according to claim 1, wherein the amount of c) is at least 20 wt. % with respect to the total composition.

5. The composition according to claim 1, wherein the total amount of b) and c) with respect to the total composition is at least 15 wt. %.

6. The composition according to claim 1, wherein b) comprises antimony tin oxide.

7. The composition according to claim 1, wherein b) comprises particles consisting of a core and a shell covering the core, wherein the shell is made of a material having an LDS additive function and wherein the core is TiO2.

8. The composition according to claim 1, wherein the composition has a dielectric constant measured at 1 GHz of at least 3.5, and/or wherein the composition has a tangent loss measured at 1 GHz of at most 0.014, and/or wherein the composition has a dielectric constant measured at 40 GHz of at least 3.5, and/or wherein the composition has a tangent loss measured at 40 GHz of a at most 0.010.

9. The composition according to claim 1, wherein b) has a particle size d50 of at most 5 μm, as determined by light scattering technology.

10. The composition according to claim 1, wherein f) is selected from stabilizers against thermal or thermo-oxidative degradation, stabilizers against hydrolytic degradation, stabilizers against degradation from light, in particular UV light, and/or photo-oxidative degradation and processing aids such as release agents and lubricants.

11. The composition according to claim 1, wherein the composition comprises less than 4 wt. % relative to the total weight of the composition.

12. A molded part comprising the composition according to claim 1.

13. A process for producing a circuit carrier, comprising the steps of:
   providing the molded part according to claim 12;
   irradiating areas of said part on which conductive tracks are to be formed with laser radiation; and
   subsequently metalizing the irradiated areas.

14. The circuit carrier obtainable by the process according to claim 13.

15. An antenna comprising the circuit carrier according to claim 14.

16. The composition according to claim 1, wherein a) is polycarbonate or a blend of polycarbonate and a rubber-like polymer.

17. The composition according to claim 16, wherein the blend is
- a blend of 45 to 75 wt. % of polycarbonate, 5 to 40 wt. % of ABS and 0 to 10 wt. % of MBS wherein the amounts are with respect to the thermoplastic resin a) or
- a blend of 80 to 99 wt. % of polycarbonate and 1 to 20 wt. % of the graft copolymer comprising an elastomeric component containing Si, wherein the amounts are with respect to the thermoplastic resin a).

18. The composition according to claim 1, wherein the composition comprises less than 3 wt. % of fillers relative to the total weight of the composition.

19. The composition according to claim 1, wherein the composition comprises less than 1 wt. % of fillers relative to the total weight of the composition.

20. The composition according to claim 1, wherein the composition comprises less than 0.1 wt. % of fillers relative to the total weight of the composition.

21. The composition according to claim 1, wherein a) is a polycarbonate-based resin, and wherein the amount of c) is at least 20 wt.% with respect to the total composition.

* * * * *